United States Patent
Chen

(10) Patent No.: US 12,279,514 B2
(45) Date of Patent: Apr. 15, 2025

(54) DISPLAY PANEL, MANUFACTURING METHOD THEREOF, AND MOBILE TERMINAL

(71) Applicant: Wuhan China Star Optoelectronics Semiconductor Display Technology Co., Ltd., Wuhan (CN)

(72) Inventor: Rongkun Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/613,963

(22) PCT Filed: Sep. 30, 2021

(86) PCT No.: PCT/CN2021/122307
§ 371 (c)(1),
(2) Date: Nov. 24, 2021

(87) PCT Pub. No.: WO2023/035347
PCT Pub. Date: Mar. 16, 2023

(65) Prior Publication Data
US 2024/0032410 A1 Jan. 25, 2024

(30) Foreign Application Priority Data
Sep. 10, 2021 (CN) .......................... 202111063543.4

(51) Int. Cl.
*H10K 77/10* (2023.01)
*B32B 15/08* (2006.01)
(Continued)

(52) U.S. Cl.
CPC ............ *H10K 77/111* (2023.02); *B32B 15/08* (2013.01); *B32B 15/09* (2013.01); *B32B 15/18* (2013.01);
(Continued)

(58) Field of Classification Search
CPC ............ H10K 77/111; H10K 2102/311; H10K 59/38; H10K 50/854; H10K 59/122; H10K 59/351
See application file for complete search history.

(56) References Cited

U.S. PATENT DOCUMENTS 11,145,833 B2 * 10/2021 Kim ................... H10K 59/1213
2010/0289993 A1 * 11/2010 Matsuyama .......... G02B 5/201
347/40
(Continued)

FOREIGN PATENT DOCUMENTS

| CN | 111968537 A | 11/2020 |
| CN | 112289185 A | 1/2021 |

(Continued)

*Primary Examiner* — Jarrett J Stark
(74) *Attorney, Agent, or Firm* — Nathan & Associates; Menachem Nathan

(57) ABSTRACT

A display panel, a manufacturing method thereof, and a mobile terminal are provided. The display panel includes a panel main body, a backboard, and a supporting layer sequentially stacked. Wherein, a shading thin film is disposed between the backboard and the supporting layer, and the shading thin film is laminated on one side of the backboard close to the supporting layer and/or on one side of the supporting layer close to the backboard.

14 Claims, 3 Drawing Sheets

(51) Int. Cl.
  *B32B 15/09*   (2006.01)
  *B32B 15/18*   (2006.01)
  *B32B 27/28*   (2006.01)
  *B32B 27/36*   (2006.01)
  *C25D 7/12*    (2006.01)
  *H10K 102/00*  (2023.01)

(52) U.S. Cl.
  CPC ............ *B32B 27/281* (2013.01); *B32B 27/36* (2013.01); *C25D 7/12* (2013.01); *B32B 2255/06* (2013.01); *B32B 2255/205* (2013.01); *B32B 2457/206* (2013.01); *H10K 2102/311* (2023.02)

(56) References Cited

U.S. PATENT DOCUMENTS

| | | | | |
|---|---|---|---|---|
| 2013/0316487 | A1* | 11/2013 | de Graff | A61B 1/04 |
| | | | | 438/66 |
| 2016/0079329 | A1* | 3/2016 | Lee | G06F 3/0412 |
| | | | | 257/40 |
| 2016/0211482 | A1* | 7/2016 | Namkung | H10K 77/111 |
| 2016/0233453 | A1* | 8/2016 | Lee | H10K 77/111 |
| 2016/0269720 | A1* | 9/2016 | Patel | H04N 13/344 |
| 2016/0293885 | A1* | 10/2016 | Park | H10K 59/8722 |
| 2016/0336537 | A1* | 11/2016 | Tsuruoka | H01L 27/1218 |
| 2017/0186823 | A1* | 6/2017 | Kim | H10K 59/8792 |
| 2017/0358624 | A1* | 12/2017 | Takeya | H01L 33/42 |
| 2018/0061894 | A1* | 3/2018 | Kim | H10K 50/865 |
| 2019/0251876 | A1* | 8/2019 | Kim | G06F 1/1652 |
| 2020/0013766 | A1* | 1/2020 | Kim | H01L 25/167 |
| 2020/0119294 | A1* | 4/2020 | Kim | H10K 71/00 |
| 2020/0203608 | A1* | 6/2020 | Jang | H10K 77/111 |
| 2020/0348553 | A1 | 11/2020 | Lee | |
| 2021/0126082 | A1* | 4/2021 | Yoon | H10K 59/1213 |
| 2021/0191185 | A1 | 6/2021 | Dai | |
| 2021/0271297 | A1 | 9/2021 | Xu | |
| 2021/0359020 | A1* | 11/2021 | Xie | H10K 59/12 |
| 2021/0408104 | A1* | 12/2021 | Lee | H01L 25/0753 |
| 2022/0158043 | A1* | 5/2022 | Lee | H01L 33/502 |
| 2022/0278173 | A1* | 9/2022 | Kong | H10K 59/351 |
| 2022/0310964 | A1* | 9/2022 | Xia | H10K 59/8794 |
| 2022/0336510 | A1* | 10/2022 | Hai | H01L 27/14603 |
| 2023/0019482 | A1* | 1/2023 | Lee | H10K 59/131 |
| 2023/0030535 | A1* | 2/2023 | Lee | H01L 33/44 |
| 2023/0261152 | A1* | 8/2023 | Tak | H01L 33/58 |
| | | | | 257/79 |
| 2024/0032410 | A1* | 1/2024 | Chen | B32B 27/36 |

FOREIGN PATENT DOCUMENTS

| | | |
|---|---|---|
| CN | 112885965 A | 6/2021 |
| CN | 112967606 A | 6/2021 |

* cited by examiner

DISPLAY PANEL, MANUFACTURING METHOD THEREOF, AND MOBILE TERMINAL

FIELD OF INVENTION

The present application relates to the field of display, and especially to a display panel, a manufacturing method thereof, and a mobile terminal.

BACKGROUND OF INVENTION

Currently, in a structure of an organic light-emitting diode (OLED) foldable screen display panel, a black buffer layer is often used to shield light leakage at an OLED area in an OLED backboard area.

With development of staking structures, in order to further improve pen/ball drop performance of an OLED module, a position of a buffer layer is possible to be changed that it is disposed on one side of a supporting layer away from a panel main body, which brings a problem that light leakage of the panel main body cannot be shielded.

SUMMARY OF INVENTION

A display panel, a manufacturing method thereof, and a mobile terminal to solve a problem that light leakage of a panel main body cannot be shielded caused by a changed staking structure of an OLED display module, and make a display have better module pen/ball drop performance.

In order to solve the above-described problem, technical approach provided by the present application is as follows:

Embodiments of the present application provide a display panel that includes:

A panel main body;
A backboard disposed on one side of the panel main body; and
A supporting layer disposed on one side of the backboard away from the panel main body;
  Wherein a shading thin film is disposed between the backboard and the supporting layer, and the shading thin film is laminated on one side of the backboard close to the supporting layer and/or on one side of the supporting layer close to the backboard.

In one embodiment, a material of the shading thin film includes ink or metal.

In one embodiment, the display panel includes a bending area, and the supporting layer includes a first stress reduction pattern located at the bending area;
  Wherein a material of the shading thin film is tin-nickel alloy, the shading thin film includes a second stress reduction pattern located at the bending area, and in a direction perpendicular to the supporting layer, an orthographic projection of the first stress reduction pattern coincides an orthographic projection of the second stress reduction pattern.

In one embodiment, the shading thin film is laminated both on one side of the backboard close to the supporting layer and on one side of the supporting layer close to the backboard, and the shading thin film includes a first shading thin film laminated on the one side of the backboard close to the supporting layer and a second shading thin film laminated on the one side of the supporting layer close to the backboard.

In one embodiment, an adhesive layer is disposed between the first shading thin film and the second shading thin film, and the first shading thin film and the second shading thin film are adhered to each other through the adhesive layer.

In one embodiment, at least one first convex part or at least one first concave part is disposed on a contact surface of the adhesive layer and the second shading thin film, and a second concave part corresponding to the first convex part or a second convex part corresponding to the first concave part is disposed on one side face of the second shading thin film facing the adhesive layer.

In one embodiment, the contact surface of the adhesive layer and the second shading thin film includes a plurality of the first convex part and a plurality of the first concave part, and each of the first concave parts is located adjacent to one of the first convex parts and spaced apart from one of the first concave parts.

In one embodiment, a material of the adhesive layer includes a pressure sensitive adhesive, a photosensitive adhesive, or a heat sensitive adhesive.

In one embodiment, the material of the adhesive layer is the pressure sensitive adhesive.

In addition, embodiments of the present application further provide a manufacturing method of a display panel that includes following steps:

Providing a panel main body;
Forming a backboard on one side face of the panel main body; and
Forming a supporting layer on one side of the backboard away from the panel main body;
  Wherein a shading thin film is formed between the backboard and the supporting layer, and the shading thin film is laminated on one side of the backboard close to the supporting layer and/or on one side of the supporting layer close to the backboard.

In one embodiment, the shading thin film is formed through any one of electroplating or printing.

Furthermore, embodiments of the present application further provide a mobile terminal that includes a display panel and a terminal main body, the terminal main body and the display panel are assembled together, and the display panel includes:

A panel main body;
A backboard disposed on one side of the panel main body; and
A supporting layer disposed on one side of the backboard away from the panel main body;
  Wherein a shading thin film is disposed between the backboard and the supporting layer, and the shading thin film is laminated on one side of the backboard close to the supporting layer and/or on one side of the supporting layer close to the backboard.

In one embodiment, a material of the shading thin film includes ink or metal.

In one embodiment, the display panel includes a bending area, and the supporting layer includes a first stress reduction pattern located at the bending area;
  Wherein a material of the shading thin film is tin-nickel alloy, the shading thin film includes a second stress reduction pattern located at the bending area, and in a direction perpendicular to the supporting layer, an orthographic projection of the first stress reduction pattern coincides an orthographic projection of the second stress reduction pattern.

In one embodiment, the shading thin film is laminated both on one side of the backboard close to the supporting layer and on one side of the supporting layer close to the backboard, and the shading thin film includes a first shading thin film laminated on the one side of the backboard close to the supporting layer and a second shading thin film laminated on the one side of the supporting layer close to the backboard.

In one embodiment, an adhesive layer is disposed between the first shading thin film and the second shading thin film, and the first shading thin film and the second shading thin film are adhered to each other through the adhesive layer.

In one embodiment, a contact surface of the adhesive layer and the second shading thin film includes a plurality of first convex parts and a plurality of first concave parts, and each of the first concave parts is located adjacent to one of the first convex parts and spaced apart from one of the first concave parts.

In one embodiment, a material of the adhesive layer includes a pressure sensitive adhesive, a photosensitive adhesive, or a heat sensitive adhesive.

In one embodiment, the material of the adhesive layer is the pressure sensitive adhesive.

Through disposing the shading thin film between the backboard and the supporting layer, and laminating the shading thin film on one side of the backboard close to the supporting layer and/or on one side of the supporting layer close to the backboard, even though a structure and a position of a buffer layer of an OLED display module vary, a same shading effect of light leakage can be realized, such that the OLED display module can have a better pen/ball drop performance.

DETAILED DESCRIPTION OF PREFERRED EMBODIMENTS

For clearer description of purposes, technical approaches, and effects of the present application, the following further describes the present application in detail with reference to accompanying drawings and embodiments. It should be understood that the specific embodiments described here are merely for understanding the present application and are not to limit the present application.

Embodiments of the present application provide a display panel and a manufacturing method thereof, and each will be described in detail as follows. It should be explained that description order of following embodiments does not limit priority of the embodiments.

Currently, in a structure of an organic light-emitting diode (OLED) foldable screen display panel, a black buffer layer is often used to shield light leakage at an OLED area in an OLED backboard area.

With development of staking structures, in order to further improve pen/ball drop performance of an OLED module, a position of a buffer layer is possible to be changed that it is disposed on one side of a supporting layer away from a panel main body, which brings a problem that light leakage of the panel main body cannot be shielded.

Figure 1:
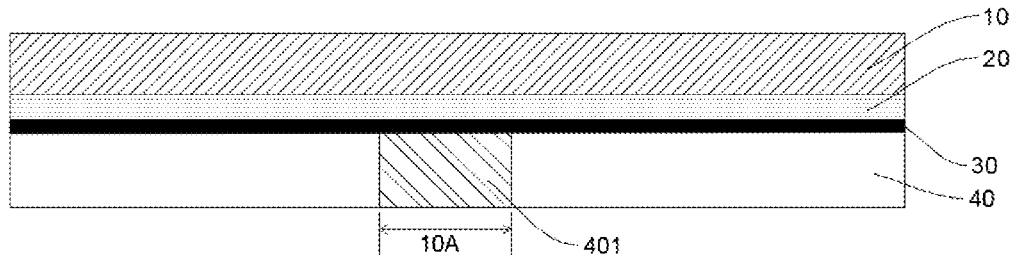
FIG. 1 is a structural schematic diagram of a display panel according to an embodiment of the present application.
Figure 2:
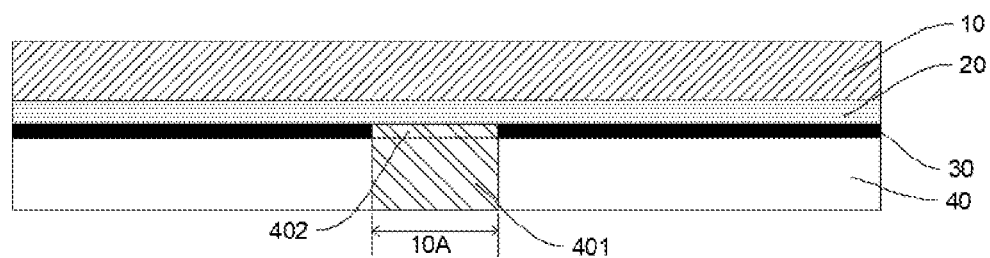
FIG. 2 is a structural schematic diagram of a display panel with a metal shading thin film according to another embodiment of the present application.

Referring to FIG. 1 and FIG. 2, embodiments of the present application provide a display panel that includes:

A panel main body 10;

A backboard 20 disposed on one side of the panel main body 10; and

A supporting layer 40 disposed on one side of the backboard 20 away from the panel main body 10;

Wherein, a shading thin film 30 is disposed between the backboard 20 and the supporting layer 40, and the shading thin film 30 is laminated on one side of the backboard 20 close to the supporting layer 40 and/or on one side of the supporting layer 40 close to the backboard 20.

Specifically, the panel main body 10 can be a flexible display panel, such as an OLED display panel.

Specifically, a material of the backboard 20 can be polyethylene terephthalate (PET) or polyimide (PI), which is not limited here.

Specifically, a material of the supporting layer 40 can be copper alloy, aluminum alloy, or steel use stainless (SUS). The supporting layer 40 is a rigid structure, and the panel main body 10 and the backboard 20 are flexible structures. Thorough disposing the supporting layer 40 under the panel main body 10 and the backboard 20, rigidity of the display panel can further be increased, such that it can be realized not only normal display of the display panel but also bending to a certain degree.

Specifically, a thickness of the shading thin film 30 can range from 0.8 μm to 3 μm, which is not limited here. Thicknesses of the shading thin film 30 that can have a shading effect are all within protection scope of the present application. A color of the shading thin film 30 can be black that has a better light absorption performance, a material of the shading thin film 30 can be ink or metal, and a whole surface of the shading thin film 30 is laminated on the backboard 20/the supporting layer 40.

It can be understood that through disposing the shading thin film 30 between the backboard 20 and the supporting layer 40, and laminating the shading thin film 30 on one side of the backboard 20 close to the supporting layer 40 and/or on one side of the supporting layer 40 close to the backboard 20, even through a structure and a position of a buffer layer of an OLED display module vary, a same shading effect of light leakage can be realized, such that the OLED display module can have a better pen/ball drop performance.

In one embodiment, a material of the shading thin film 30 includes ink or metal. Specifically, the material of the shading thin film 30 has a dark color that can absorb light. The ink and the metal are both black that can further increase shading effect. The ink can be disposed on the backboard 20 or the supporting layer 40 through coating, and the metal can be formed on the supporting layer 40 through electroplating. It can be understood that, through using this technical approach, an obtained thickness of the shading thin film 30 is thinner, which does not affect a thickness of the whole display panel, in conformity with development trend of decreasing thicknesses of display panels.

Figure 3:
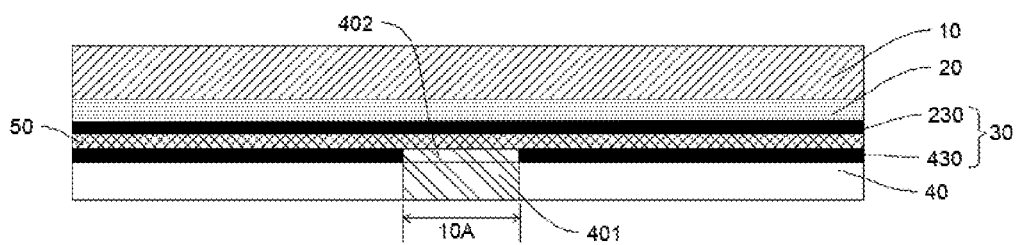
FIG. 3 is a structural schematic diagram of a display panel with two layers of shading thin films according to an embodiment of the present application.

In one embodiment, as shown in FIG. 3, the display panel includes a bending area 10A, and the supporting layer 40 includes a first stress reduction pattern 401 located at the bending area 10A.

A material of the shading thin film 30 is tin-nickel alloy, and the shading thin film 30 includes a second stress reduction pattern 402 located at the bending area 10A. In a direction perpendicular to the supporting layer an orthographic projection of the first stress reduction pattern 401 coincides an orthographic projection of the second stress reduction pattern 402.

Specifically, the first stress reduction pattern 401 can be a plurality of columns of through holes, and the columns of through holes are spaced apart. In the direction perpendicular to the supporting layer 40, the orthographic projection of the second stress reduction pattern 402 coincides the orthographic projection of the first stress reduction pattern 401, such that the first stress reduction pattern 401 and the second stress reduction pattern 402 can use a same mask for etching, effectively reducing manufacturing processes, and decreasing production cost.

It can be understood that, through disposing a stress reduction pattern at the bending area 10A of the supporting layer 40, a supporting board at the bending area 10A can have a better bending performance, preventing the supporting layer 40 from fracturing. When the material of the shading thin film 30 is metal, through disposing a stress reduction pattern on the shading thin film 30, a shading thin film 30 layer can also be prevented from delamination caused by many times of bending, which decreases a shading effect.

In one embodiment, the shading thin film 30 is laminated both on one side of the backboard 20 close to the supporting layer 40 and on one side of the supporting layer 40 close to the backboard 20, and the shading thin film 30 includes a first shading thin film 230 laminated on the one side of the backboard 20 close to the supporting layer 40 and a second shading thin film 430 laminated on the one side of the supporting layer 40 close to the backboard 20.

Specifically, a material of the first shading thin film 230 and the second shading thin film 430 can be same or different. For example, a material of the first shading thin film 230 is black ink, and a material of the second shading thin film is a black tin-nickel alloy. The first shading thin film 230 is applied on the backboard 20 through inkjet printing or coating, and the second shading thin film 430 is formed on the supporting layer 40 through electroplating.

It can be understood that, through disposing two layers of shading thin films 30 including the first shading thin film 230 and the second shading thin film 430, where the two layers of shading thin films 30 are manufactured using different processes, during use of the display panel, a problem that a part of the shading thin film 30 corresponding to where the display panel is bended is delaminated caused by many times of bending and folding and causes partial light leakage is mitigated. When one layer of the shading thin films 30 is delaminated, the other layer of the shading thin films 30 can supplementally shield light.

Figure 4:
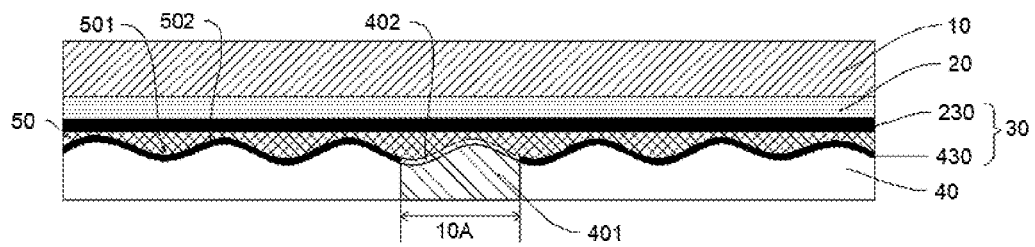
FIG. 4 is a structural schematic diagram of a display panel according to another embodiment of the present application.

In one embodiment, as shown in FIG. 3 and FIG. 4, an adhesive layer 50 is disposed between the first shading thin film 230 and the second shading thin film 430, and the first shading thin film 230 and the second shading thin film 430 are adhered to each other through the adhesive layer 50.

Specifically, a material of the adhesive layer 50 is a pressure sensitive adhesive, a photosensitive adhesive, or a heat sensitive adhesive.

It can be understood that, through disposing the adhesive layer 50, because a material of the adhesive layer 50 is an adhesive, it has a better adhesion performance, such that the flexible backboard 20 and the rigid supporting layer 40 can be better adhered together, decreasing risk of delamination of the flexible backboard 20 and the rigid supporting layer 40 after many times of bending the display panel.

In one embodiment, as shown in FIG. 4, at least one first convex part 501 or at least one first concave part 502 is disposed on a contact surface of the adhesive layer 50 and the second shading thin film 430, and a second concave part corresponding to the first convex part 501 or a second convex part corresponding to the first concave part 502 is disposed on one side face of the second shading thin film 430 facing the adhesive layer 50.

Specifically, an edge of a cross section of the first convex part 501 or the second concave part disposed on the contact surface of the second shading thin film 430 is an arc, so that a surface of the second shading thin film 430 has a concave and convex structure, and when there is a problem of light leakage, the light has a diffusion-reflection effect on the surface, further increasing shading effect of the display panel.

Specifically, the edge of the cross section of the first convex part 501 or the second concave part disposed on the contact surface of the second shading thin film 430 is an arc, so that the surface of the second shading thin film 430 has the concave and convex structure, such that an area of the contact surface of the adhesive layer 50 and the second shading thin film 430 is increased, decreasing probability of delamination between film layers.

It can be understood that, through disposing at least one first convex part 501 or at least one first concave part 502 on the contact surface of the adhesive layer 50 and the second shading thin film 430, and disposing the second concave part corresponding to the first convex part 501 or the second convex part corresponding to the first concave part 502 on one side face of the second shading thin film 430 facing the adhesive layer 50, a diffusion-reflection structure is formed between the second shading thin film and the adhesive layer 50, further increasing shading effect. Meanwhile, adhesiveness between film layers of the display panel can also be increased, decreasing risk of delamination between the film layers.

In one embodiment, as shown in FIG. 4, the contact surface of the adhesive layer 50 and the second shading thin film 430 includes a plurality of the first convex parts 501 and a plurality of the first concave part 502, and each of the first concave parts 502 is located adjacent to one of the first convex parts 501 and spaced apart from one of the first concave parts 502.

Specifically, each of the plurality of first convex parts 501 is located adjacent to one of the plurality of first concave parts 502 and spaced apart from one of the plurality of first convex parts 501, such that one side of a vertical section of the adhesive layer 50 close to the second shading thin film 430 has a wave shape, facilitating processing of the adhesive layer 50.

It can be understood that, through disposing the plurality of first convex parts 501 and the plurality of first concave parts 502 on the contact surface of the adhesive layer 50 and the second shading thin film 430, and disposing the second concave part corresponding to the first convex part 501 and the second convex part corresponding to the first concave part 502 on one side face of the second shading thin film 430 facing the adhesive layer 50, a diffusion-reflection structure is formed between the second shading thin film and the adhesive layer 50 by the plurality of first convex parts 501 and the plurality of first concave parts 502, further increasing shading effect. Meanwhile, adhesiveness between film layers of the display panel can also be increased, decreasing risk of delamination between the film layers.

Referring again to the above-described embodiment, because the second shading thin film 430 is thinner, it is not easy to form a structure where one side face is flat, and the other side face has convex parts and concave parts. Therefore, one side face of the supporting layer 40 close to the second shading thin film 430 can be manufactured to have a structure with recesses and protrusions corresponding to the second concave part and the second convex part, and then the second shading thin film 430 is uniformly electroplated on the supporting layer 40, realizing a structure of the second shading thin film 430 having the second concave part and the second convex part. Using this technical approach, a thickness of the second shading thin film 430 can be equal everywhere.

Figure 5:
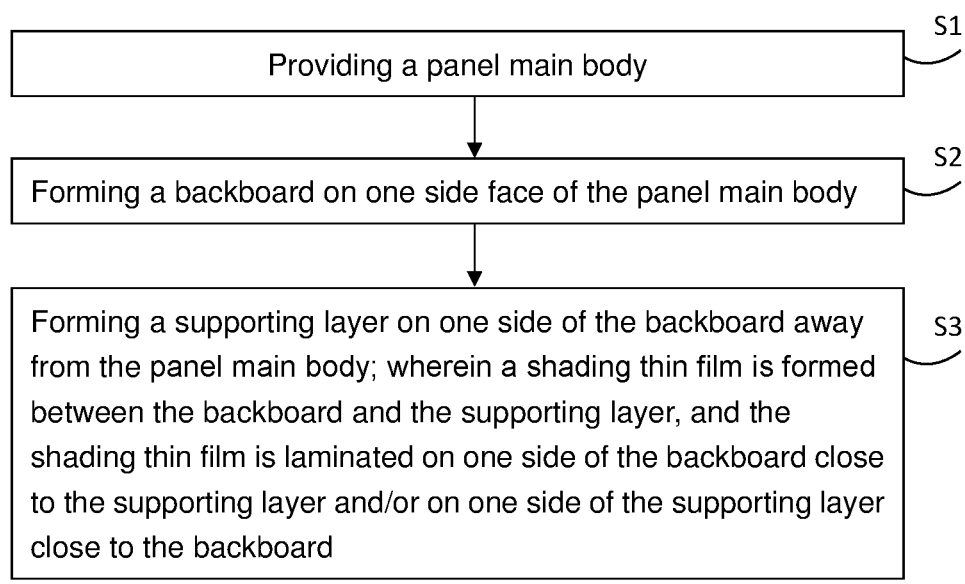
FIG. 5 is a flowchart of a manufacturing method of a display panel according to an embodiment of the present application.

In addition, embodiments of the present application further provide a manufacturing method of a display panel, as shown in FIG. 5, including following steps:

S1, providing a panel main body 10;

S2, forming a backboard 20 on one side face of the panel main body 10; and

S3, forming a supporting layer 40 on one side of the backboard 20 away from the panel main body 10; wherein a shading thin film 30 is formed between the backboard 20 and the supporting layer 40, and the shading thin film 30 is laminated on one side of the backboard 20 close to the supporting layer 40 and/or on one side of the supporting layer 40 close to the backboard 20.

It can be understood that through disposing the shading thin film 30 between the backboard 20 and the supporting layer 40, and laminating the shading thin film 30 on one side of the backboard 20 close to the supporting layer 40 and/or on one side of the supporting layer 40 close to the backboard 20, even though a structure and a position of a buffer layer of an OLED display module vary, a same shading effect of light leakage can be realized, such that the OLED display module can have a better pen/ball drop performance.

In the present embodiment, regarding specific structures of the display panel, please refer to the above-described embodiments of the display panel and FIG. 1-FIG. 4, and repeated description is omitted here.

In one embodiment, the shading thin film 30 is formed through any one of electroplating or printing.

Specifically, using the shading thin film 30 being black ink as an example, it can be manufactured through coil coating, baking, and drying coils of the backboard 20, obtaining coils of the backboard 20 with black ink coating. Steps of a manufacturing method of the display panel is as follows:

Providing a panel main body 10;

Cutting the above-described manufactured coils of the backboard 20, and laminating the backboard 20 on one side face of the panel main body 10; and Forming a supporting layer 40 on one side of the backboard away from the panel main body 10.

Specifically, using the shading thin film 30 being a black tin-nickel alloy and the supporting layer 40 being SUS as an example. A manufacturing method can be coil electroplating coils of the SUS by tin-nickel alloy, and one side of the coils of the SUS that needs not to be electroplated is shielded using a baffle, realizing one-side electroplating of tin-nickel alloy of steel use stainless, and obtaining coils of the SUS electroplated with black tin-nickel alloy. Steps of a manufacturing method of the display panel is as follows:

Providing a panel main body 10;

Cutting coils of the backboard 20, and laminating the backboard 20 on one side face of the panel main body 10; and Exposing, developing, and etching coils of SUS electroplated with a black tin-nickel alloy to form a first stress reduction pattern 401 and a second stress reduction pattern 402 of a supporting layer 40 and a shading thin film 30 layer, and assembling the supporting layer 40 patterned with the shading thin film 30 to the panel main body 10 and the backboard 20.

Specifically, the supporting layer 40 can be patterned first, and then electroplated, and the shading thin film 30 can further be patterned after electroplating. This technical approach has obvious more steps compared to that of the previous embodiment, is more complicated, but a shading effect of the shading thin film 30 obtained is same.

The present invention further provides a mobile terminal, the mobile terminal includes the display panel of any one of the above-described embodiments and a terminal main body, and the terminal main body is assembled together with the display panel.

In summary, through disposing the shading thin film 30 between the backboard 20 and the supporting layer 40, and laminating the shading thin film 30 on one side of the backboard 20 close to the supporting layer 40 and/or on one side of the supporting layer 40 close to the backboard 20, even though a structure and a position of a buffer layer of an OLED display module vary, a same shading effect of light leakage can be realized, such that the OLED display module can have a better pen/ball drop performance.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A display panel, comprising:
    a panel main body;
    a backboard disposed on one side of the panel main body; and
    a supporting layer disposed on one side of the backboard away from the panel main body;
    wherein a shading thin film is disposed between the backboard and the supporting layer, and the shading thin film is laminated on one side of the backboard close to the supporting layer or on one side of the supporting layer close to the backboard;
    wherein a material of the shading thin film comprises ink or metal;
    wherein the display panel comprises a bending area, the supporting layer comprises a first stress reduction pattern located at the bending area;
    wherein a material of the shading thin film is tin-nickel alloy, the shading thin film comprises a second stress reduction pattern located at the bending area, and in a direction perpendicular to the supporting layer, an orthographic projection of the first stress reduction pattern coincides an orthographic projection of the second stress reduction pattern.

2. The display panel as claimed in claim 1, wherein the shading thin film is laminated both on one side of the backboard close to the supporting layer and on one side of the supporting layer close to the backboard, and the shading thin film comprises a first shading thin film laminated on the one side of the backboard close to the supporting layer and a second shading thin film laminated on the one side of the supporting layer close to the backboard.

3. The display panel as claimed in claim 2, wherein an adhesive layer is disposed between the first shading thin film and the second shading thin film, and the first shading thin film and the second shading thin film are adhered to each other through the adhesive layer.

4. The display panel as claimed in claim 3, wherein at least one first convex part or at least one first concave part is disposed on a contact surface of the adhesive layer and the second shading thin film, and a second concave part corresponding to the first convex part or a second convex part corresponding to the first concave part is disposed on one side face of the second shading thin film facing the adhesive layer.

5. The display panel as claimed in claim 4, wherein the contact surface of the adhesive layer and the second shading thin film comprises a plurality of the first convex part and a plurality of the first concave part, and each of the first concave parts is located adjacent to one of the first convex parts and spaced apart from one of the first concave parts.

6. The display panel as claimed in claim 3, wherein a material of the adhesive layer comprises a pressure sensitive adhesive, a photosensitive adhesive, or a heat sensitive adhesive.

7. The display panel as claimed in claim 6, wherein the material of the adhesive layer is the pressure sensitive adhesive.

8. A mobile terminal, comprising a display panel and a terminal main body, wherein the terminal main body and the display panel are assembled together, and the display panel comprises:
a panel main body;
a backboard disposed on one side of the panel main body; and
a supporting layer disposed on one side of the backboard away from the panel main body;
wherein a shading thin film is disposed between the backboard and the supporting layer, and the shading thin film is laminated on one side of the backboard close to the supporting layer or on one side of the supporting layer close to the backboard;
wherein a material of the shading thin film comprises ink or metal;
wherein the display panel comprises a bending area, and the supporting layer comprises a first stress reduction pattern located at the bending area;
wherein a material of the shading thin film is tin-nickel alloy, the shading thin film comprises a second stress reduction pattern located at the bending area, and in a direction perpendicular to the supporting layer, an orthographic projection of the first stress reduction pattern coincides an orthographic projection of the second stress reduction pattern.

9. The mobile terminal as claimed in claim 8, wherein the shading thin film is laminated both on one side of the backboard close to the supporting layer and on one side of the supporting layer close to the backboard, and the shading thin film comprises a first shading thin film laminated on the one side of the backboard close to the supporting layer and a second shading thin film laminated on the one side of the supporting layer close to the backboard.

10. The mobile terminal as claimed in claim 9, wherein an adhesive layer is disposed between the first shading thin film and the second shading thin film, and the first shading thin film and the second shading thin film are adhered to each other through the adhesive layer.

11. The mobile terminal as claimed in claim 10, wherein an adhesive layer is disposed between the first shading thin film and the second shading thin film, and the first shading thin film and the second shading thin film are adhered to each other through the adhesive layer.

12. The mobile terminal as claimed in claim 11, wherein a contact surface of the adhesive layer and the second shading thin film comprises a plurality of first convex parts and a plurality of first concave parts, and each of the first concave parts is located adjacent to one of the first convex parts and spaced apart from one of the first concave parts.

13. The mobile terminal as claimed in claim 11, wherein a material of the adhesive layer comprises a pressure sensitive adhesive, a photosensitive adhesive, or a heat sensitive adhesive.

14. The mobile terminal as claimed in claim 13, wherein the material of the adhesive layer is the pressure sensitive adhesive.

* * * * *